United States Patent
Sun et al.

(10) Patent No.: US 9,819,930 B2
(45) Date of Patent: Nov. 14, 2017

(54) TIME OF FLIGHT IMAGING WITH IMPROVED INITIATION SIGNALING

(71) Applicant: OMNIVISION TECHNOLOGIES, INC., Santa Clara, CA (US)

(72) Inventors: Tianjia Sun, San Jose, CA (US); Rui Wang, San Jose, CA (US); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 378 days.

(21) Appl. No.: 14/721,424

(22) Filed: May 26, 2015

(65) Prior Publication Data
US 2016/0353084 A1 Dec. 1, 2016

(51) Int. Cl.
| | |
|---|---|
| H04N 13/02 | (2006.01) |
| H04N 5/374 | (2011.01) |
| G01S 7/486 | (2006.01) |
| G01S 17/89 | (2006.01) |
| G01S 7/481 | (2006.01) |

(Continued)

(52) U.S. Cl.
CPC ....... *H04N 13/0253* (2013.01); *G01S 7/4816* (2013.01); *G01S 7/4863* (2013.01); *G01S 7/4865* (2013.01); *G01S 7/497* (2013.01); *G01S 17/89* (2013.01); *H01L 27/14609* (2013.01); *H01L 27/14634* (2013.01); *H04N 5/374* (2013.01); *H04N 13/02* (2013.01);
(Continued)

(58) Field of Classification Search
CPC .............................. H01N 5/374; H04N 13/02
See application file for complete search history.

(56) References Cited

U.S. PATENT DOCUMENTS

| | | | |
|---|---|---|---|
| 7,994,465 B1 * | 8/2011 | Bamji | G01S 7/4816 250/214 R |
| 9,024,245 B2 * | 5/2015 | Oh | G01S 17/89 250/208.1 |

(Continued)

FOREIGN PATENT DOCUMENTS

| | | |
|---|---|---|
| TW | 201306647 A | 2/2013 |
| TW | 201312144 A | 3/2013 |

(Continued)

OTHER PUBLICATIONS

TW Patent Application No. 105116314—Taiwanese Search Report, dated Dec. 28, 2016, with English Translation, 2 pages.

*Primary Examiner* — Charlie Y Peng
(74) *Attorney, Agent, or Firm* — Christensen O'Connor Johnson Kindness PLLC

(57) ABSTRACT

A time of flight sensor includes control circuitry and a time of flight pixel array. The control circuitry is coupled to synchronously send a sync signal. The time of flight pixel array includes a plurality of time of flight pixel cells. Each one of the time of flight pixel cells includes a photosensor and a delay circuit. The photosensor is configured to generate an image signal in response to receiving photons from a light pulse reflected from an object. The delay circuit is coupled to generate a delayed sync signal in response to the sync signal. The delay circuit includes a delay transistor. The time of flight pixel array includes a transistor gradient where a transistor gate length of the delay transistor varies so that each of the time of flight pixel cells receive their respective delayed sync signal at a same time.

20 Claims, 6 Drawing Sheets

(51) Int. Cl.
    *G01S 7/497*    (2006.01)
    *H01L 27/146*   (2006.01)
    *H04N 13/00*    (2006.01)
(52) U.S. Cl.
    CPC ..... *H04N 13/021* (2013.01); *H01L 27/14627* (2013.01); *H04N 2013/0081* (2013.01)

(56) References Cited

U.S. PATENT DOCUMENTS

| | | | |
|---|---|---|---|
| 9,097,521 B2* | 8/2015 | Chung | G01C 3/08 |
| 9,185,762 B2* | 11/2015 | Mark | G01J 1/46 |
| 9,442,186 B2* | 9/2016 | Payne | G01S 7/493 |
| 9,523,765 B2* | 12/2016 | Sun | G01S 17/105 |
| 9,578,311 B2* | 2/2017 | Hall | H04N 5/2256 |
| 2010/0303299 A1 | 12/2010 | Cho et al. | |
| 2013/0162778 A1 | 6/2013 | Kurokawa | |
| 2013/0181119 A1 | 7/2013 | Bikumandla et al. | |
| 2013/0228691 A1 | 9/2013 | Shah | |
| 2014/0160461 A1 | 6/2014 | Van Der Tempel et al. | |
| 2014/0183338 A1* | 7/2014 | Fossum | G01S 17/89 250/208.1 |
| 2014/0211192 A1 | 7/2014 | Grootjans et al. | |
| 2016/0344965 A1* | 11/2016 | Grauer | H04N 5/353 |

FOREIGN PATENT DOCUMENTS

| | | |
|---|---|---|
| TW | 201329875 A | 7/2013 |
| TW | 201330613 A | 7/2013 |
| TW | 201339644 A | 10/2013 |

* cited by examiner

TIME OF FLIGHT IMAGING WITH IMPROVED INITIATION SIGNALING

TECHNICAL FIELD

This disclosure relates generally to imaging systems and in particular to time of flight imaging systems.

BACKGROUND INFORMATION

Interest in three dimensional (3D) cameras is increasing as the popularity of 3D applications continues to grow in applications such as imaging, movies, games, computers, user interfaces, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera in order to create the three dimensional images. In addition, this technique is complex and therefore requires significant computer processing power in order to create the 3D images in real time.

For applications that require the acquisition of 3D images in real time, active depth imaging systems based on the optical time of flight measurement are sometimes utilized. Time of flight systems typically employ a light source that directs light at an object and a sensor that detects the light that is reflected from the object. The time between the emission from the light source and the detection of reflected light by the sensor indicates the distance of the object in relation to the sensor. Electronic signals are sent within the time of flight system to coordinate the emission of the light by the light source and the detection of the reflected light by the sensor. However, delays in the electronic signals can compromise the time of flight calculations that indicate the distance of the object from the sensor. Previous approaches to reducing signal delay include reducing the resistance and capacitance of the metal interconnect, however design rules limit the width of the metal interconnect and therefore the achievable resistance value floor (and hence the propagation delay of electronic signals). The use of digital algorithms to calibrate the resultant delayed signal has also been previously used. However, this increases the processing requirements of a time of flight system.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a time of flight image sensor and a time of flight imaging system are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
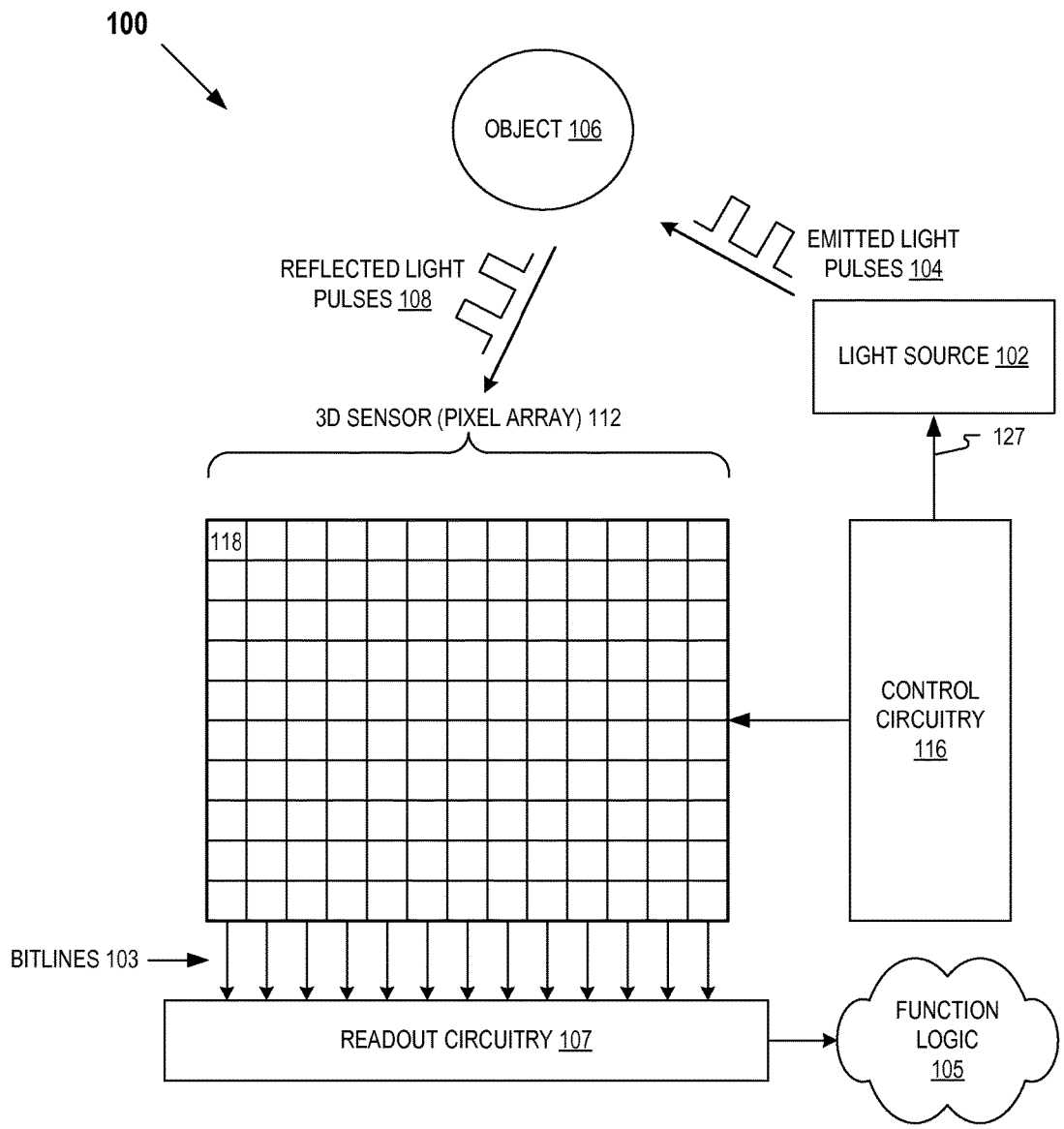
FIG. 1 is a block diagram of an example time of flight sensing system, in accordance with an embodiment of the disclosure.

FIG. 1 is a block diagram of an example time of flight sensing system 100, in accordance with an embodiment of the disclosure. As shown, the illustrated example of time of flight sensing system 100 includes a time of flight pixel array 112, readout circuitry 107, function logic 105, control circuitry 116, and a light source 102 to sense the round trip distance to object 106. In the example illustrated in FIG. 1, pixel array 112 is a two dimensional (2D) array of time of flight pixel cells 118. In one embodiment, the 2D array is 1920 pixels cells 118 in width and 1080 pixels cells 118 in height. As illustrated, each pixel cell 118 is arranged into a row and a column to acquire time of flight information of an image object 106 focused onto pixel array 112. Thus, the time of flight information can then be used to determine the distance or depth information to the object 106.

In one example, control circuitry 116 controls and synchronizes light source 102 with an emission signal 127 to emit light pulses 104 to object 106. The reflected back light pulses 108 are then reflected back to pixel array 112 as shown. The pixel cells 118 in pixel array 112 sense the photons from the reflected back light pulses 108 and generate image signals in response to the incident photons. Readout circuitry 107 then reads out the image signals through bitlines 103, as shown. In one example, readout circuitry 107 may include analog to digital converters and amplifiers to convert and amplify the image signals received through bitlines 103. The image signals read out by readout circuitry 107 may then be transferred to digital circuits included in the function logic 105. In one example, function logic 105 may determine the time of flight and distance information for each pixel cell 118. In one example, function logic may also store the time of flight information and/or even manipulate the time of flight information (e.g., crop, rotate, and/or adjust for background noise). In one example, readout circuitry 107 reads out an entire row of time of flight information at a time along the bitlines 103 (illustrated), or in another example may readout the time of flight information using a variety of other techniques (not illustrated), such as a serial readout or a full parallel readout of all pixels simultaneously. In the illustrated example, control circuitry 116 is further coupled to pixel array 112 to control the operation of pixel array 112, as well as synchronize the operation of pixel array 112 with light source 102. For example, control circuitry 116 may initiate a global sync signal to each of the pixel cells 118 that is synchronized with emission signal 127 to initiate a time of flight image capture.

Light source 102 is a narrow-band infrared light-emitting-diode (LED), in one embodiment. Pixel array 112 may be covered by a bandpass optical filter that passes the same wavelength of infrared light that is emitted by light source 102 and passes other wavelengths of light such that pixel array 112 only receives light with the wavelength of the narrow-band infrared LED. This arrangement decreases the likelihood that ambient light will skew the measurement of time of flight sensing system 100.

Time of flight sensing system 100 may be implemented in a stacked chip scheme. For instance, pixel array 112 may be included in a pixel die, while read out circuitry 101, function logic 105, and control circuitry 116 may be included in a separate ASIC die. In that example, the pixel die and ASIC die are stacked and coupled together during fabrication to implement time of flight sensing system 100.

Figure 2A:
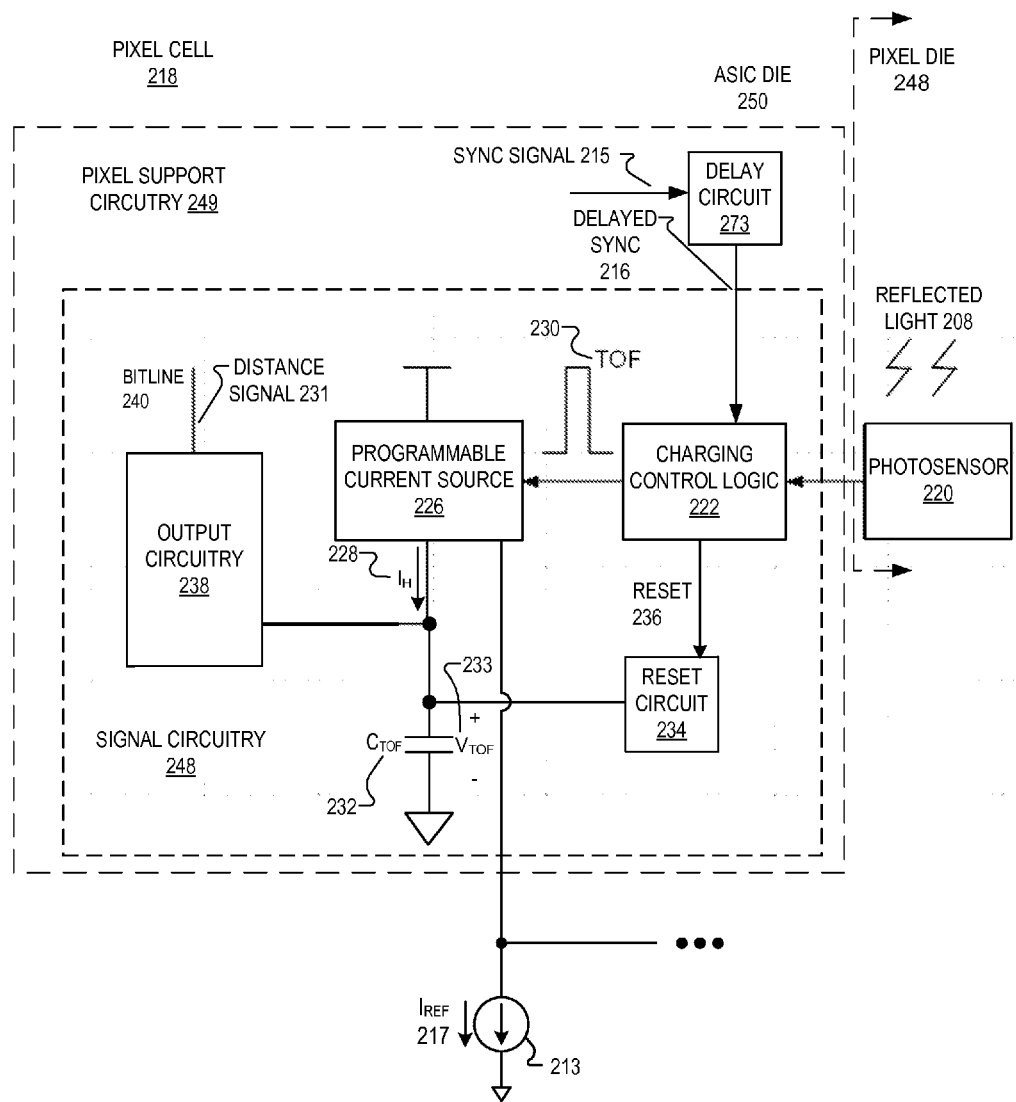
FIG. 2A illustrates a block diagram schematic of an example pixel cell of a time of flight sensor, in accordance with an embodiment of the disclosure.

FIG. 2A illustrates a block diagram schematic of an example time of flight pixel cell 218 of a time of flight sensor, in accordance with an embodiment of the disclosure. Pixel cell 218 is one example of the pixel cells 118 shown in FIG. 1. As shown in the depicted example, pixel cell 218 includes a photosensor 220 and pixel support circuitry 249. Pixel support circuitry 249 includes charging control logic 222, programmable current source 226, capacitor $C_{TOF}$ 232, reset circuit 234, and output circuitry 238. Photosensor 220 senses photons of reflected light 208, which are reflected from object 106. In one example photosensor 220 may include a single photon avalanche diode (SPAD).

Photosensor 220 may include Geiger-mode photon detection cells such as single photon avalanche diodes (SPADs) that are fabricated on a silicon substrate. Geiger-mode APDs produce a pulse of the same amplitude when struck by a photon. They have a p-n junction that is biased above the breakdown voltage such that each electron-hole pair can trigger an avalanche multiplication process that causes current at the output of the photon detection cell to reach its final value quickly. This avalanche current continues until a quenching element is used to quench the avalanche process. The sensitivity of a SPAD to even one photon makes it an appropriate choice for time of flight applications.

Delay circuit 273 is coupled to generate a delayed sync signal 216 in response to receiving sync signal 215 from control circuitry 116. Control circuitry 116 is coupled to send sync signal 215 to all of the pixel cells at the same time it initiates a light pulse emission from light source 102. As discussed previously, it would be ideal if a global sync signal arrived at each pixel simultaneously to obtain the best calculation of the time of flight for each pixel cell 218. However, the signal paths for sync signal 215 to each pixel cell are different lengths due to the physical disposition of each pixel cell 218. Therefore, propagation delay from the differing signal path lengths contributes to less accurate time of flight calculations. For example, in FIG. 4, a network of drivers 420 of control circuitry 116 delivers the sync signal 215 to the pixel cells. However, the network of drivers 420 is distributed around the edges of the pixel array 412. Hence, without delay compensation, pixel cells in the middle of pixel array 412 will receive the sync signal 215 later than pixel cells along the edges of pixel array 412 since the pixel cells near the edges are closer to the drivers 420. However, strategically inserting varying delay circuits in different delay tiers of the time of flight sensor 400 will allow the sync signal to reach each pixel cell at essentially the same time.

Figure 2B:
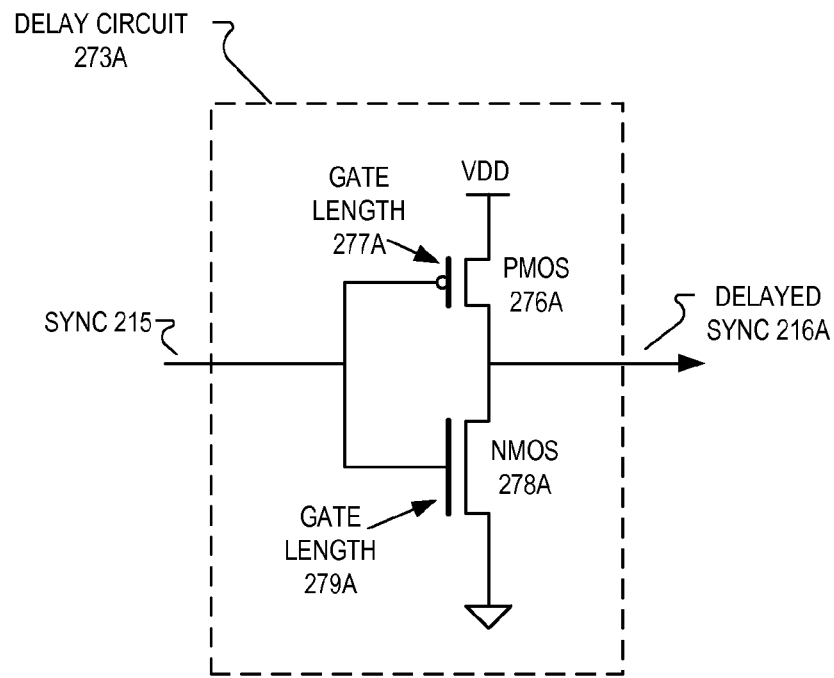
FIG. 2B illustrates example delay circuits that include transistors with varying transistor gate lengths, in accordance with an embodiment of the disclosure.

FIG. 2B illustrates example delay circuits 273A and 273B that include transistors with varying transistor gate lengths, in accordance with an embodiment of the disclosure. Delay circuits 273A and 273B are examples of delay circuit 273. Delay circuit 273A and 273B are inverters. Hence, where sync signal 215 is a logic low, delayed sync signals 216A and 216B will be logic high. In delay circuit 273A, P-channel metal-oxide-semiconductor (PMOS) 276A is coupled to supply voltage VDD and NMOS 278A. The gate of PMOS 276A is coupled to receive sync signal 215. Also in delay circuit 273A, N-channel metal-oxide-semiconductor NMOS 278A is coupled to a reference (e.g. ground) and the gate of NMOS 278A is also coupled to receive sync signal 215.

Delay circuit 273B is similar to delay circuit 273A except that the gate length 277B of PMOS 276B is longer than the gate length 277A of PMOS 276A. Additionally, the gate length 279A of NMOS 278A is longer than the gate length 279B of NMOS 278B. In delay circuits 273A and 273B, the longer the gate length 277, the longer the delay will be to generate the delayed sync signals 216. Therefore, when delay circuit 273A receives a logic low as sync signal 215, generating the corresponding logic high for delayed sync signal 216A will take place in a shorter amount of time than delay circuit 273B generating a logic high for delayed sync signal 216B in response to the same sync signal 215. Consequently, delay circuit 273A can be used in pixel cells 118 that are close to the center of pixel array 112 (and farther from driver 420) and delay circuits 273B can be used in pixel cells 118 that are closer to the drivers 420. And furthermore, the gate lengths of the PMOS transistors in other delay circuits can be adjusted more finely to generate delays that are somewhere in between the delays generated by delay circuits 273A and 273B.

Figure 4:
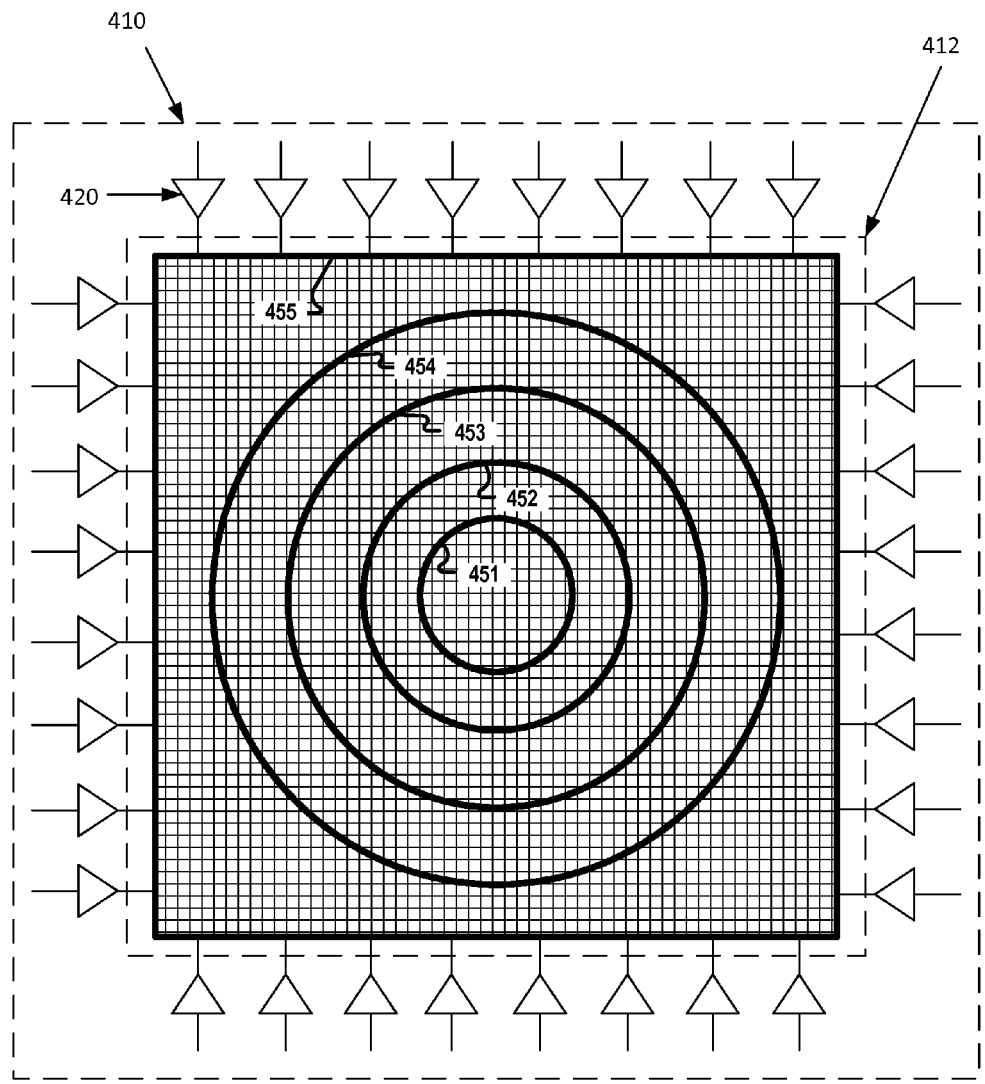
FIG. 4 illustrates a time of flight sensor that includes a transistor gradient corresponding to example delay tiers of the time of flight sensors, in accordance with an embodiment of the disclosure.

FIG. 4 illustrates a time of flight sensor 410 that includes a transistor gradient corresponding to example delay tiers of pixel array 412 included in time of flight sensor 410, in accordance with an embodiment of the disclosure. FIG. 4 includes example delay tiers 451, 452, 453, 454, and 455 within pixel array 412 which includes a plurality of pixel cells 218. The pixel cells 218 within delay tier 455 have a delay circuit 273 that includes a delay transistor (e.g. PMOS 276) imparting a longer delay of sync signal 215 than a delay circuit 273 in delay tier 454. Configuring the gate length of the delay transistor in delay circuits 273 differently in different delay tiers allows sync signal 216 to reach reaches signal circuitry 248 in the different delay tiers at (essentially) the same time. Similarly, the delay circuits 273 in delay tier 454 will impart a longer delay of sync signal 215 than the delay circuits 273 in delay tier 453, the delay circuits 273 in delay tier 453 will impart a longer delay of sync signal 215 than the delay circuits 273 in delay tier 452, and the delay circuits 273 in delay tier 452 will impart a longer delay of sync signal 215 than the delay circuits 273 in delay tier 451. The delay circuits 273 in delay tier 451 may be designed to have no delay or the lowest amount of delay possible. In general, the delay of sync signal 215 is longer at the edges of pixel array 412 and gets shorter as the pixel cells 218 get closer to the center of pixel array 412 since the propagation delay from drivers 420 gets longer as the pixel cells 218 move farther from the drivers 420. This forms a transistor gradient where transistor gate lengths of the delay transistor vary (by getting progressively larger or smaller) to allow each of the pixel cells to receive their respective delayed sync signals 216 at (essentially) the same time.

It is understood that delay tiers 451-455 are exemplary and that the actual delay tiers may vary depending on the physical locations of the drivers 420. Additionally, the gate length of the delay transistors may be modified on a pixel cell-by-pixel cell basis in some examples so that there is a continuous (grey-scale) adjustment of the gate lengths of the delay transistors as the pixel cell gets farther away from drivers 420. Furthermore, although the illustrated example of delay circuit 273 includes increasing the gate length 277 of PMOS 276 to increase the delay of sync signal 215, it is understood by those skilled in the art that in different circuit configurations, modifying the gate length of an NMOS transistor could effect the disclosed delay of sync signal 215.

Referring again to FIG. 2A, signal circuitry 248 is coupled to generate a distance signal 231 in response to receiving delayed sync signal 216 and the image signal from photosensor 220. Distance signal 231 is representative of the distance from the object 106 to the particular pixel cell 218. Charging control logic 222 of signal circuitry 248 is coupled to photosensor 220 to detect when the photosensor 220 senses the photons of reflected light 208 that are reflected from the object 106. Charging control logic 222 is further coupled to receiving delayed sync signal 216 from delay circuit 273. Signal circuitry 248 is configured to generate a time of flight (TOF) signal 230 in response to receiving the image signal from the photosensor and receiving delayed sync signal 216. TOF signal 230 is representative of a time between emitting one of the light pulses from light source 102 and receiving the photons from that light pulses at pixel cell 218

Programmable current source 226 is coupled to receive TOF signal 230. Programmable current source 226 is coupled to a reference current source 213 that sinks (FIG. 2A) or supplies reference current $I_{REF}$ 217 to current source 226 in response to TOF signal 230. Reference current source 213 is coupled to provide a reference current $I_{REF}$ 217 to all the pixel cells 218 included in pixel array 112, in one embodiment. In the illustrated embodiment, current source 226 is coupled to supply constant current $I_H$ 228 to charge capacitor $C_{TOF}$ 232 in response to TOF signal 230.

A voltage $V_{TOF}$ 233 accumulated on capacitor CTOF 232 is representative of a round trip distance from light source 102 to object 106, back to pixel cell 218. In FIG. 2B, reset circuit 234 is coupled to capacitor $C_{TOF}$ 232 to reset the accumulated voltage $V_{TOF}$ 233 on capacitor $C_{TOF}$ 232 in response to a reset signal (not illustrated) received from control circuitry 116 after accumulated voltage $V_{TOF}$ 233 has been read out from capacitor $C_{TOF}$ 232 via output circuitry 238. As shown in the example, signal circuitry 248 also includes output circuitry 238 to read out $V_{TOF}$ accumulated on capacitor $C_{TOF}$. Output circuitry 238 may include an output switch, amplifier, and row select switch to selectively couple capacitor $C_{TOF}$ to bitline 240 for readout purposes. Reset circuit 234 may include a transistor that resets voltage 233 to a reference voltage (e.g. ground). In one example, charging control logic 222 includes a latch coupled to receive delayed sync signal 216 and the image signal from photosensor 220 and reset circuit 234 resets the latch in charging control logic 222 after voltage $V_{TOF}$ 233 is readout. Reset circuit 234 may also reset circuitry in charging control logic 222 when reset circuit 234 is reset in response to the reset signal from control circuitry 116.

Figure 5:
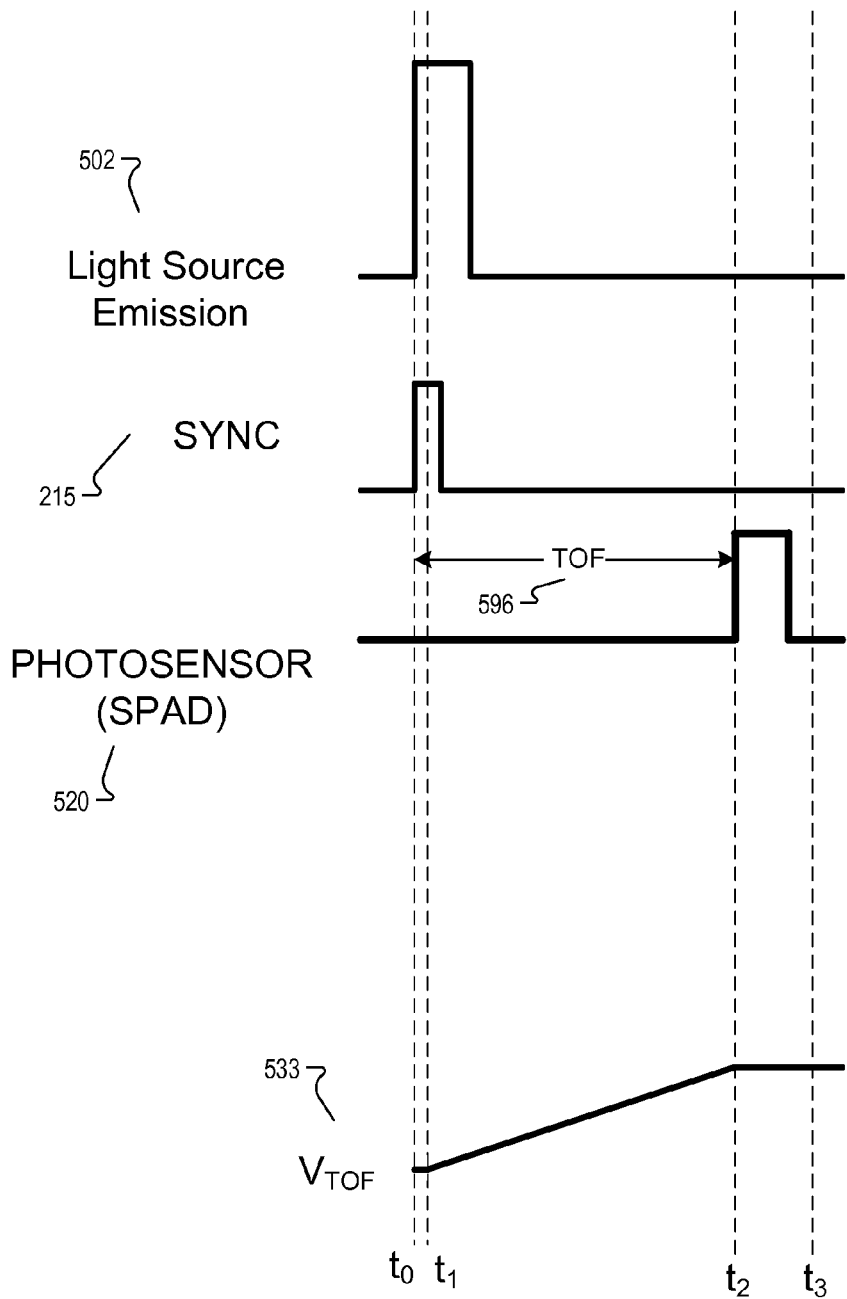
FIG. 5 illustrates a timing diagram showing a voltage on a capacitor in relation to a light source emission and reception of reflected light by a time of flight sensor, in accordance with an embodiment of the disclosure.

To further illustrate the functionality of example pixel support circuitry 249, FIG. 5 illustrates an example timing diagram 500 showing example voltage $V_{TOF}$ 533 on capacitor 232 in relation to a light source emission and reception of reflected light by a time of flight sensor, in accordance with an embodiment of the disclosure. At time t0, light source 102 is activated to emit a light pulse illustrate by light source emission waveform 502. Also at time t0, sync signal 515 transitions to logic high and is distributed to the pixel cells 218 in pixel array 112 so that each pixel cell 218 can start their time of flight measurement in synchronization with the emission of a light pulse 104 by light source 102. At time t2, reflected light pulse 108 is received by photosensor 220 causing photosensor 220 to generate a logic high signal, as shown in waveform 520. The time of flight 596 of the light pulse emitted by light source 102 is calculated by measuring the time between emitting the light pulse 104 and receiving the reflected light pulse 108. Once the time of flight (TOF) is known, a distance L from light source 102 to object 106 can be determined using the following relationships in Equations 1 and 2 below:

$$TOF = \frac{2 \times L}{c} \quad (1)$$

$$L = \frac{T_{TOF} \times c}{2} \quad (2)$$

where c is the speed of light, which is approximately equal to $3 \times 10^8$ m/s, and TOF is the amount of time that it takes for the light pulse to travel to and from the object as shown in FIG. 1.

At time t1, respective delayed sync signals 216 (not illustrated in FIG. 5) are received by the signal circuitry 248 of the pixel cells 218. The time between time t0 and time t1 will be the same for each of the pixel cells 218, although the time t0 and time t1 will be split between the inherent propagation delay of sync signal 215 and the designed delay introduced by delay circuit 273. The inherent propagation and the designed delay integrated into delay circuit 273 for each pixel cell will be divided so that all of the pixel cells receive their delayed sync signal 216 at the same time. Between time t1 and time t2, current source 226 charges capacitor 232 by way of constant current $I_H$ 228, which increases the voltage on capacitor 232 at a known rate, as shown. When TOF signal 230 indicates photons incident on photosensor 220, current source 226 ceases supplying constant current $I_H$ 228 to capacitor 232 and the voltage level of capacitor 232 holds at a steady voltage. Therefore, the higher voltage 233 is, the longer the time of flight 596 of the emitted pulse, and therefore the longer the distance to object 106 for the particular pixel cell 218. At time t3, voltage 233 on capacitor 232 may be read out as distance signal 231 that is representative of the distance from the light source 102 to the object 106. Since the time between time t0 and time t1 is known and designed into the time of flight sensor, distance signal 231 can be adjusted or calibrated to factor in the known delay between time t0 and time t1 in the distance calculations described above.

As discussed above, it is ideal for delayed sync signal 216 to be received by signal circuitry 248 at (essentially) the same time so that each pixel cell 218 starts its time of flight measurement at the same time regardless of the pixel cell's proximity to a driver 420. Light source emission 502 illustrates a pulse of light 104 being emitted from light source 102 in response to emission signal 127. Sync signal 215 is sent to the pixel cells 218 in pixel array 112 so that each pixel cell can start their time of flight measurement in synchronization with the emission of a light pulse 104.

Figure 2B:
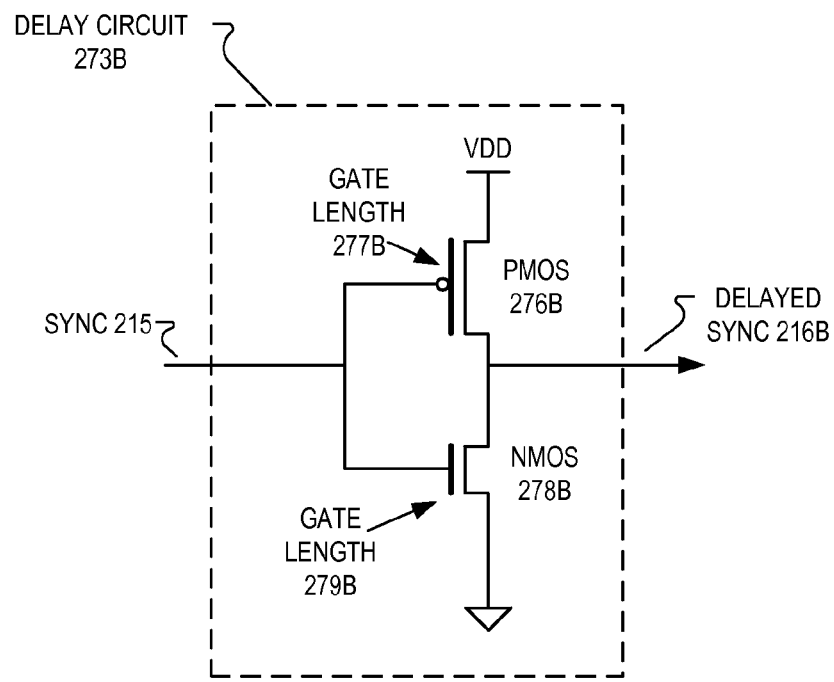
Figure 3:
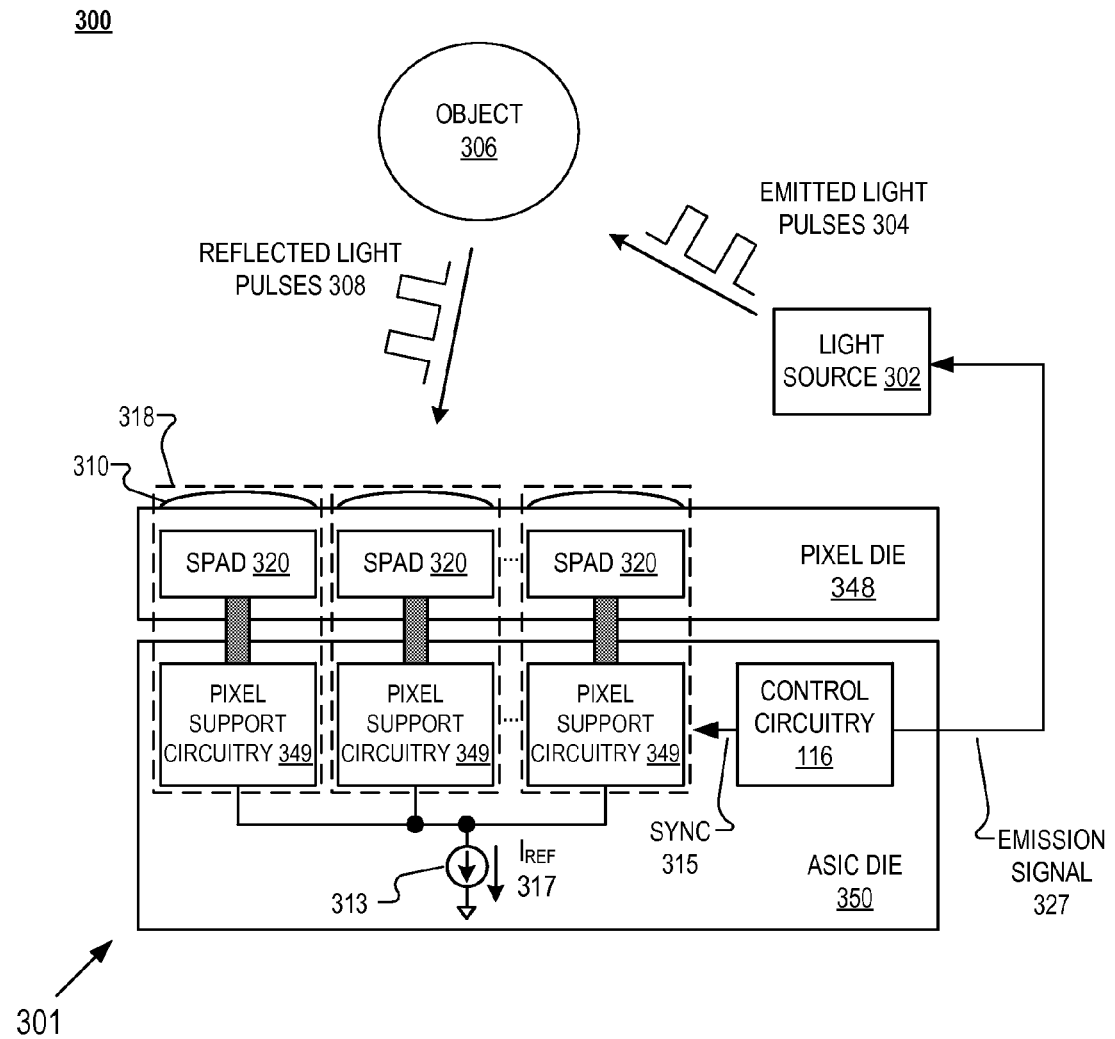
FIG. 3 illustrates a cross section of a time of flight sensor included in a time of flight imaging system, in accordance with an embodiment of the disclosure.

FIG. 2A illustrates that time of flight pixel cells 218 may be implemented in a stacked chip scheme. For instance, as shown in the example, photosensor 220 may be included in a pixel die 247, while pixel support circuitry 249 of pixel cell 218 illustrated in FIG. 2 may be included in a separate ASIC die 250. FIG. 3 illustrates a cross section of a time of flight sensor 301 included in a time of flight sensing system 300, in accordance with an embodiment of the disclosure. Time of flight sensing system 300 is implemented with pixel die 348 coupled to ASIC die 350 in a stack chip scheme, in FIG. 3. As shown, time of flight sensing system 300 includes light source 302 that emits light pulses 304, which are directed at object 306. Emitted light pulses 304 are reflected back from object 306 which are shown as reflected light pulses 308.

In one example, time of flight sensing system 300 also includes pixel die 348, which includes a plurality of pixel cells, including pixel cell 318, arranged in a time of flight pixel array. In the example, each pixel cell 318 includes photosensor 320, which in the illustrated example includes a SPAD which is optically coupled to receive reflected light pulses 308 from object 306 through a respective microlens 310 as shown. In another example, microlens 310 may be omitted. Each photosensor 320 of each pixel cell 318 is coupled to corresponding pixel support circuitry 349, which as shown is disposed in ASIC die 350.

As shown in the depicted example, pixel support circuitry 349 of each pixel cell 318 is also coupled to single reference current source 317 included in ASIC die 350. Reference current source 317 is coupled to provide reference current $I_{REF}$ 313 for use by each pixel support circuitry 349 to program an internal programmable current source included in each pixel support circuitry 349. In the illustrated example, control circuitry 116 is also included in ASIC die 350 and is coupled to synchronously provide emission signal 327 to light source 302 and pixel cells 318. Emitted light pulses 304 are emitted from light source 302 in response to emission signal 327 and sync signal 315 is sent to the pixel cells 318 so that each pixel cell 318 can start their time of flight measurement in synchronization with the emission of a light pulse 304.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A time of flight sensing system, comprising:
a light source to emit light pulses to an object;
control circuitry coupled to send a sync signal when one of the light pulses is emitted by the light source; and
a time of flight pixel array having a plurality of time of flight pixel cells, wherein each one of the time of flight pixel cells comprises:
a photosensor configured to generate an image signal in response to receiving photons from the light pulse reflected from the object;
a delay circuit coupled to generate a delayed sync signal in response to the sync signal, wherein the delay circuit includes a delay transistor, and wherein the time of flight pixel array includes a transistor gradient where a transistor gate length of the delay transistor varies as the time of flight pixel cells get closer to a center of the time of flight pixel array so that each of the time of flight pixel cells receive their respective delayed sync signal at a same time; and
signal circuitry coupled to generate a distance signal in response to receiving the delayed sync signal and the image signal, wherein the distance signal is representative of a distance from the photosensor to the object.

2. The time of flight sensing system of claim 1, wherein the signal circuitry includes charging control logic coupled to generate a time of flight (TOF) signal in response to receiving the image signal and the delayed sync signal, the TOF signal representative of a time between emitting one of the light pulses and receiving the photons from the light pulse at the respective time of flight pixel cell.

3. The time of flight sensing system of claim 2, wherein the signal circuitry further includes a capacitor and a current source, wherein the current source supplies current to the capacitor to charge the capacitor in response to receiving the TOF signal from the charging control logic, a voltage on the capacitor representative of the distance from the photosensor to the object.

4. The time of flight sensing system of claim 3, wherein the signal circuitry further includes a reset circuit coupled to reset the voltage on the capacitor.

5. The time of flight sensing system of claim 3, wherein the signal circuitry further includes output circuitry including an amplifier coupled to the capacitor, wherein the amplifier is coupled to amplify the voltage on the capacitor onto a readout bitline.

6. The time of flight sensing system of claim 3, wherein the current sources in each of the time of flight pixel cells are coupled to a same reference current driver.

7. The time of flight sensing system of claim 1, wherein the transistor gate length decreases as the time of flight pixel cells get closer to the center of the time of flight pixel array.

8. The time of flight sensing system of claim 7, wherein the delay circuit includes an inverter that includes the delay transistor, and wherein the delay transistor is a P-channel Metal-oxide-semiconductor (PMOS) transistor.

9. The time of flight sensing system of claim 1 further comprising readout circuitry coupled to readout the distance signal from each of the time of flight pixel cells.

10. The time of flight sensing system of claim 1, wherein the photosensor includes an avalanche photodiode.

11. The time of flight sensing system of claim 1, wherein the light source is an infrared light-emitting-diode (LED).

12. A time of flight sensor, comprising:
control circuitry coupled to synchronously send a sync signal and an emission signal to a light source, wherein the emission signal activates the light source to emit a light pulse; and
a time of flight pixel array having a plurality of time of flight pixel cells, wherein each one of the time of flight pixel cells comprises:
a photosensor configured to generate an image signal in response to receiving photons from the light pulse reflected from an object;

a delay circuit coupled to generate a delayed sync signal in response to the sync signal, wherein the delay circuit includes a delay transistor, and wherein the time of flight pixel array includes a transistor gradient where a transistor gate length of the delay transistor varies so that each of the time of flight pixel cells receive their respective delayed sync signal at a same time; and signal circuitry coupled to generate a distance signal in response to receiving the delayed sync signal and the image signal, wherein the distance signal is representative of a distance from the photosensor to the object.

13. The time of flight sensor of claim 12, wherein the signal circuitry includes charging control logic coupled to generate a time of flight (TOF) signal in response to receiving the image signal and the delayed sync signal, the TOF signal representative of a time between emitting the light pulse and receiving the photons from the light pulse at the respective time of flight pixel cell.

14. The time of flight sensor of claim 13, wherein the signal circuitry further includes a capacitor and a current source, wherein the current source supplies current to the capacitor to charge the capacitor in response to receiving the TOF signal from the charging control logic, a voltage on the capacitor representative of the distance from the photosensor to the object.

15. The time of flight sensor of claim 14, wherein the signal circuitry further includes a reset circuit coupled to reset the voltage on the capacitor.

16. The time of flight sensor of claim 14, wherein the signal circuitry further includes output circuitry including an amplifier coupled to the capacitor, wherein the amplifier is coupled to amplify the voltage on the capacitor onto a readout bitline.

17. The time of flight sensor of claim 14, wherein the current sources in each of the time of flight pixel cells are coupled to a same reference current driver.

18. The time of flight sensor of claim 12, wherein the transistor gate length decreases as the time of flight pixel cells get closer to a center of the time of flight pixel array.

19. The time of flight sensor of claim 18, wherein the delay circuit includes an inverter that includes the delay transistor, and wherein the delay transistor is a P-channel Metal-oxide-semiconductor (PMOS) transistor.

20. The time of flight sensor of claim 12 further comprising readout circuitry coupled to readout the distance signal from each of the time of flight pixel cells.

* * * * *